(12) United States Patent
Ganesan et al.

(10) Patent No.: US 7,131,091 B1
(45) Date of Patent: Oct. 31, 2006

(54) GENERATING FAST LOGIC SIMULATION MODELS FOR A PLD DESIGN DESCRIPTION

(75) Inventors: Satish R. Ganesan, Mountain View, CA (US); Goran Bilski, Molndal (CH); Usha Prabhu, West Lafayette (IN); Paulo L. Dutra, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 245 days.

(21) Appl. No.: 10/930,430

(22) Filed: Aug. 31, 2004

(51) Int. Cl.
*G06F 17/50* (2006.01)

(52) U.S. Cl. ................ 716/6; 716/2; 716/4; 716/5; 716/16; 716/18

(58) Field of Classification Search .............. 716/2, 716/4–6, 16, 18; 703/19
See application file for complete search history.

(56) References Cited

U.S. PATENT DOCUMENTS

| | | | |
|---|---|---|---|
| 5,648,909 A * | 7/1997 | Biro et al. ............... | 716/6 |
| 6,324,678 B1 * | 11/2001 | Dangelo et al. .......... | 716/18 |
| 6,385,759 B1 * | 5/2002 | Batarekh ................. | 716/6 |
| 6,591,402 B1 * | 7/2003 | Chandra et al. .......... | 716/5 |
| 6,606,734 B1 | 8/2003 | Greaves | |
| 6,622,287 B1 * | 9/2003 | Henkel ................... | 716/2 |
| 2004/0225970 A1 * | 11/2004 | Oktem .................... | 716/1 |

OTHER PUBLICATIONS

Raimund Ubar, Joan Raik, Adam Morawiec; "Back-Tracing and Event-Driven Techniques in High-Level Simulation with Decision Diagrams"; ISCAS 2000—IEEE International Symposium on Circuits and Systems; May 28-31, 2000; pp. I-208-I-211.
Samir Palnitkar, Darrell Parham; "Cycle Simulation Techniques"; 1995 IEEE; pp. 2-8.

* cited by examiner

*Primary Examiner*—Paul Dinh
(74) *Attorney, Agent, or Firm*—LeRoy D. Maunu

(57) ABSTRACT

Various approaches for generating a clock accurate simulation model from a circuit design description are disclosed. In one approach, a graph representation of the circuit design description is created. The graph representation includes nodes and edges. From the nodes in the graph representation, a plurality of register nodes are generated to correspond to respective register functions. Logic optimization is performed on nodes that represent combinational logic functions. For each register node and each output node, an evaluation equation is generated after performing logic optimization. For each clock cycle of a logic simulation, each evaluation equation is evaluated and produces an output value for the next clock cycle.

20 Claims, 4 Drawing Sheets

GENERATING FAST LOGIC SIMULATION MODELS FOR A PLD DESIGN DESCRIPTION

FIELD OF THE INVENTION

The present invention generally relates to generating a simulation model from a design description of a digital system.

BACKGROUND

The operation of a digital system may be predicted by a logic simulation. A logic simulation of a digital system may be used to predict the operation of the system prior to implementing the system in hardware, based on a description of the system in a hardware description language (HDL). The logic simulation may predict system operation by providing a time sequence of values for every output and every internal signal of the digital system when given a particular time sequence of values for the inputs of the digital system. The response of the digital system may be predicted for various input scenarios by respective logic simulations.

During the development of a digital system, a designer may examine the predicted operation provided by logic simulations of various scenarios to discover unintended behavior. Unintended behavior is typically exposed by a symptom that occurs somewhat later in simulation time than the cause of the unintended behavior. A designer may use the signal values generated by the logic simulation to trace backwards in simulation time from the symptom of a defect to the cause of a defect.

Logic simulation is invaluable to discover and fix defects in a digital system prior to implementing the digital system in hardware. Execution speed is an important characteristic of a logic simulation. The execution speed of a logic simulation may determine how long a designer has to wait for the results for a scenario. The execution speed may limit the number scenarios that may be attempted.

The present invention may address one or more of the above issues.

SUMMARY OF THE INVENTION

The various embodiments of the invention generate a clock accurate simulation model from a circuit design description are disclosed. In one embodiment, a graph representation of the circuit design description is created. The graph representation includes nodes and edges. From the nodes in the graph representation, a plurality of register nodes are generated to correspond to respective register functions. Logic optimization is performed on nodes that represent combinational logic functions. For each register node and each output node, an evaluation equation is generated after performing logic optimization. For each clock cycle of a logic simulation, each evaluation equation is evaluated and produces an output value for the next clock cycle.

In another embodiment, and apparatus is provided for generating a clock accurate simulation model from a circuit design description. The apparatus includes means for creating a graph representation of the circuit design description, wherein the graph representation includes nodes and edges, each node representing a circuit function from the design description, and each edge representing a signal flow between two nodes; means for generating from the nodes in the graph representation a plurality of register nodes corresponding to respective register functions; means for performing logic optimization on nodes that represent combinational logic functions; and means for generating an evaluation equation for each register node and each output node after performing logic optimization, wherein for each clock cycle of a logic simulation, each evaluation equation is evaluated and produces an output value for the next clock cycle.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Logic simulation is invaluable to discover and fix defects in a digital system prior to implementing the digital system. Accuracy and execution speed are two important characteristics of a logic simulation. An accurate logic simulation may provide the value of every signal of a digital system at every moment in time. A trade-off may be made between accuracy and execution speed for a logic simulation.

Event driven simulation may provide a value for every signal of a digital system at every moment in time; however, event driven simulators may have a slow execution speed. Many digital systems are synchronous systems having one or more clock domains with each clock domain having a corresponding clock signal. In a synchronous system, the final value for each signal in each clock cycle may fully describe the operation of the system. Cycle-based simulation may provide, with improved execution speed, a value for every signal of a synchronous digital system, but only at the clock cycle boundaries.

Additional improvement of execution speed may be obtained for synchronous digital systems by a clock accurate simulation that calculates the values at clock boundaries only for register outputs and system outputs, as may be done in various embodiments of the invention. Optimization of the equations used by the logic simulator to calculate the values of the register and system outputs may further improve execution speed, as may be done in various embodiments of the invention.

A digital system may be implemented on a programmable logic device (PLD), such as a field programmable gate array (FPGA). A digital system implemented on a PLD may have an HDL description that includes PLD primitives and encrypted design description. To handle a digital system containing instantiated PLD primitives, existing logic simulators may need to process a library of behavioral descriptions of the PLD primitives. Existing logic simulators may not be able to decrypt the encrypted design description, and thus may not be capable of simulating the encrypted design description. Designers of digital systems that are targeted to be implemented on a PLD may need a logic simulator that handles instantiated PLD primitives and encrypted design description.

The various embodiments of the invention provide simulation models for logic simulation of synchronous digital systems with improved execution speed. PLD primitives and encrypted design description are succinctly handled in further embodiments of the invention.

Figure 1:
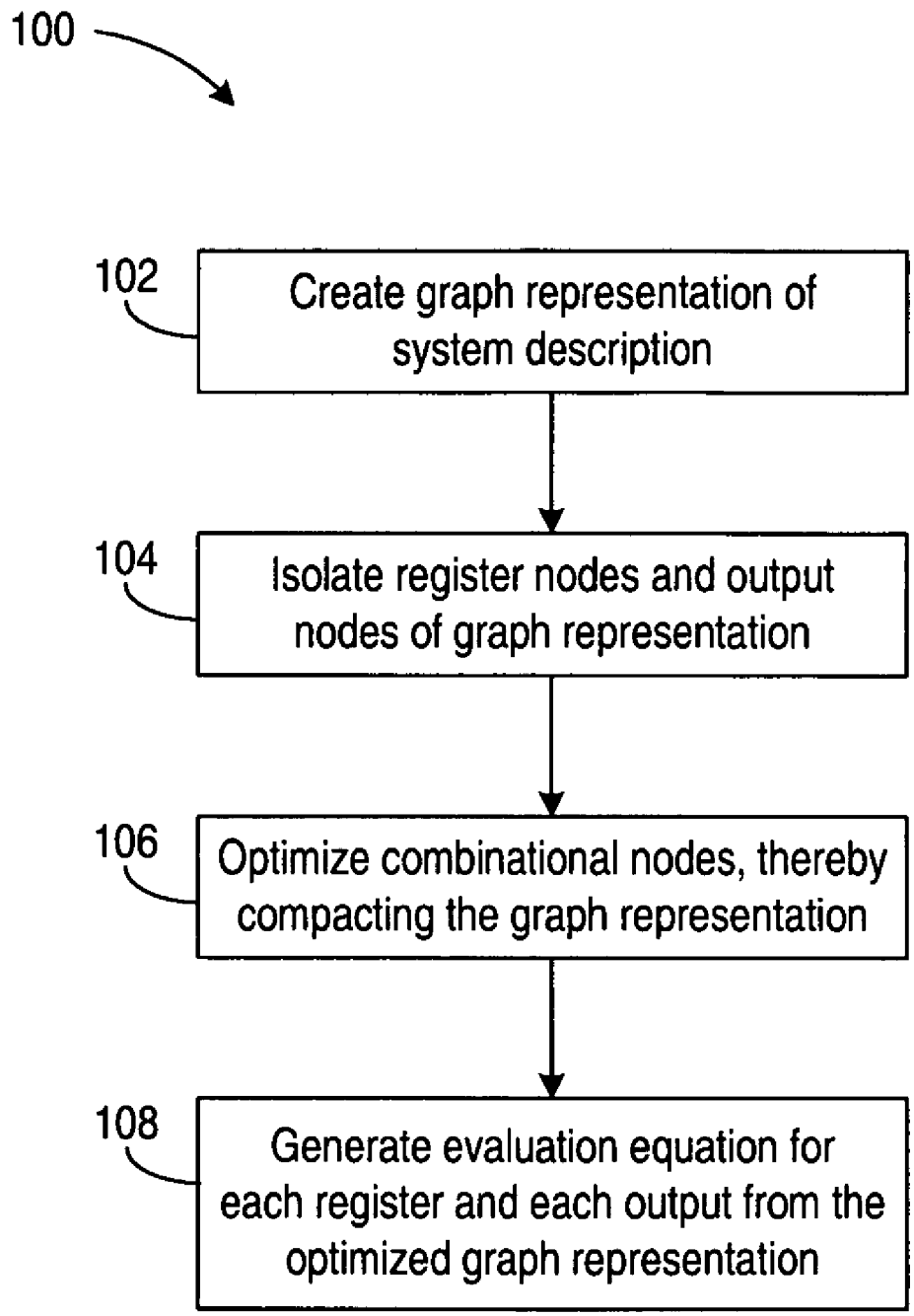
FIG. 1 is a flow diagram of an example process for generating a simulation model for a synchronous digital system in accordance with various embodiments of the invention.

FIG. 1 is a flow diagram of an example process for generating a simulation model for a synchronous digital system in accordance with various embodiments of the invention. The synchronous digital system is described in a hardware description language (HDL), and this HDL description is the input to the process 100.

At step 102, the HDL description is parsed to generate a graph representation of the system. The graph representation may include nodes and edges, with nodes of various types for the blocks of the system and edges between nodes for the signal or signal vectors connecting the blocks. The graph representation may be a flattened representation that removes the structural hierarchy from the design. Any encrypted design description included in the HDL description may be decrypted. This permits cycle accurate models to be generated for encrypted design specifications, and the implementation details of the design are thereby hidden from the user. The generated simulation model is a functional representation that is valid at every clock edge.

The graph representation is analyzed at step 104 to isolate individual register nodes in the graph representation. Output nodes of the digital system are also isolated, although typically the output nodes are already isolated before graph analysis. During the isolation of register nodes, each node containing both a storage function and a combinational function may need to be split into a register node and a combinational node. For some HDLs, such as Verilog, registers may be inferred from behavioral descriptions during analysis of the graph representation.

At step 106, the combinational logic nodes are optimized to compact the graph representation. Heuristics may be used to compact the graph representation. The compaction optimization may include a sub-step similar to that used by a synthesis tool in generating a compact hardware implementation for the synchronous digital system. The compaction optimization may include a synthesis sub-step that may be used to generate a simulation model, a hardware implementation, or both as the designer prefers.

At step 108, the simulation model is produced by generating an evaluation equation from the optimized graph representation for each register and each output isolated at step 104. For each clock cycle of a logic simulation, each evaluation equation may be evaluated to produce output values and register update values for the next clock cycle from the values for the registers and inputs for the current clock cycle.

Figure 2:
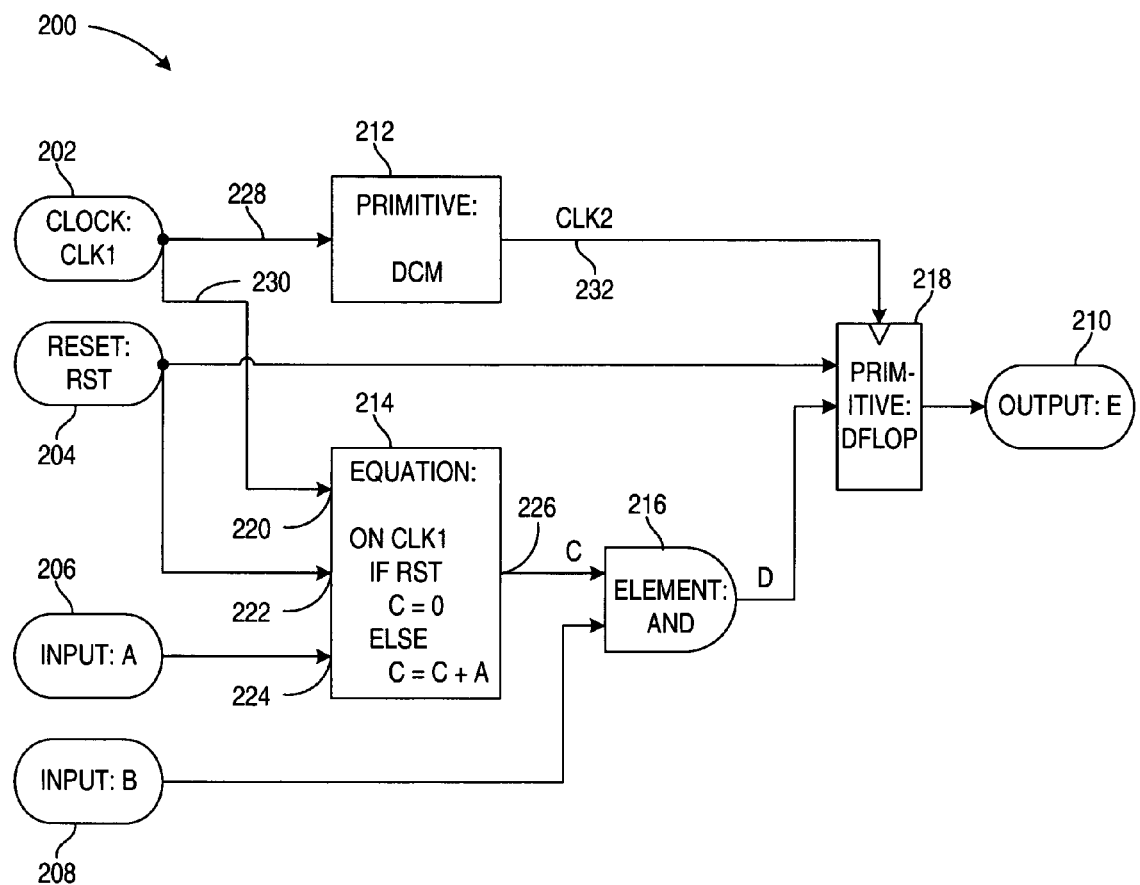
FIG. 2 is a graph representation of an example synchronous digital system for a PLD.

FIG. 2 is a graph representation of an example synchronous digital system for a PLD. The graph representation includes a clock node 202, a reset node 204, input nodes 206 and 208, and an output node 210. The graph representation includes nodes for a digital clock manager (DCM) primitive 212, an equation 214, an element 216, and a flip-flop primitive 218. The graph representation may be annotated with ports for each node. For example, equation node 214 may have a clock port 220, a reset port 222, an input port 224, and an output port 226. Edges between nodes represent signal connections between the ports of the corresponding nodes.

The equation node 214 represents a block of the system with a behavioral description in the HDL. A behavioral description is a high-level description. The hardware implementation of a behavioral description generally requires a mapping to low-level blocks to implement the function of the behavioral description.

The element node 216 represents an instance of a low-level block that is instantiated with a structural description in the HDL. Element nodes, such as node 216, represent general purpose functions that are independent of the technology chosen for implementation. Depending upon the implementation technology, a hardware implementation of an element may have a directly corresponding physical block.

The primitives represented by nodes 212 and 218 may correspond to physical blocks of a PLD. A hardware implementation of a system that includes instances of PLD primitives, such as 212 and 218, generally requires that a PLD be used for the hardware implementation. An HDL description of a digital system targeted for hardware implementation on a PLD typically instantiates PLD primitives.

During synthesis of a digital system targeting a hardware implementation in a PLD that includes primitives, such as 212 and 218, the primitives are typically directly mapped to physical blocks of the PLD that implement the corresponding function. The DCM primitive represented by node 212 may implement generation of dependent clocks, and the flip-flop primitive represented by node 218 may implement a register function.

The clock node 202 provides the master clock signal, CLK1 (edges 228 and 230), which controls system timing. The DCM primitive represented by node 212 generates an additional clock signal with a fixed timing relationship. For example, the CLK1 signal from node 202 may be multiplied by an integer, divided by an integer, and phase shifted to generate the CLK2 signal on line 232.

Figure 3:
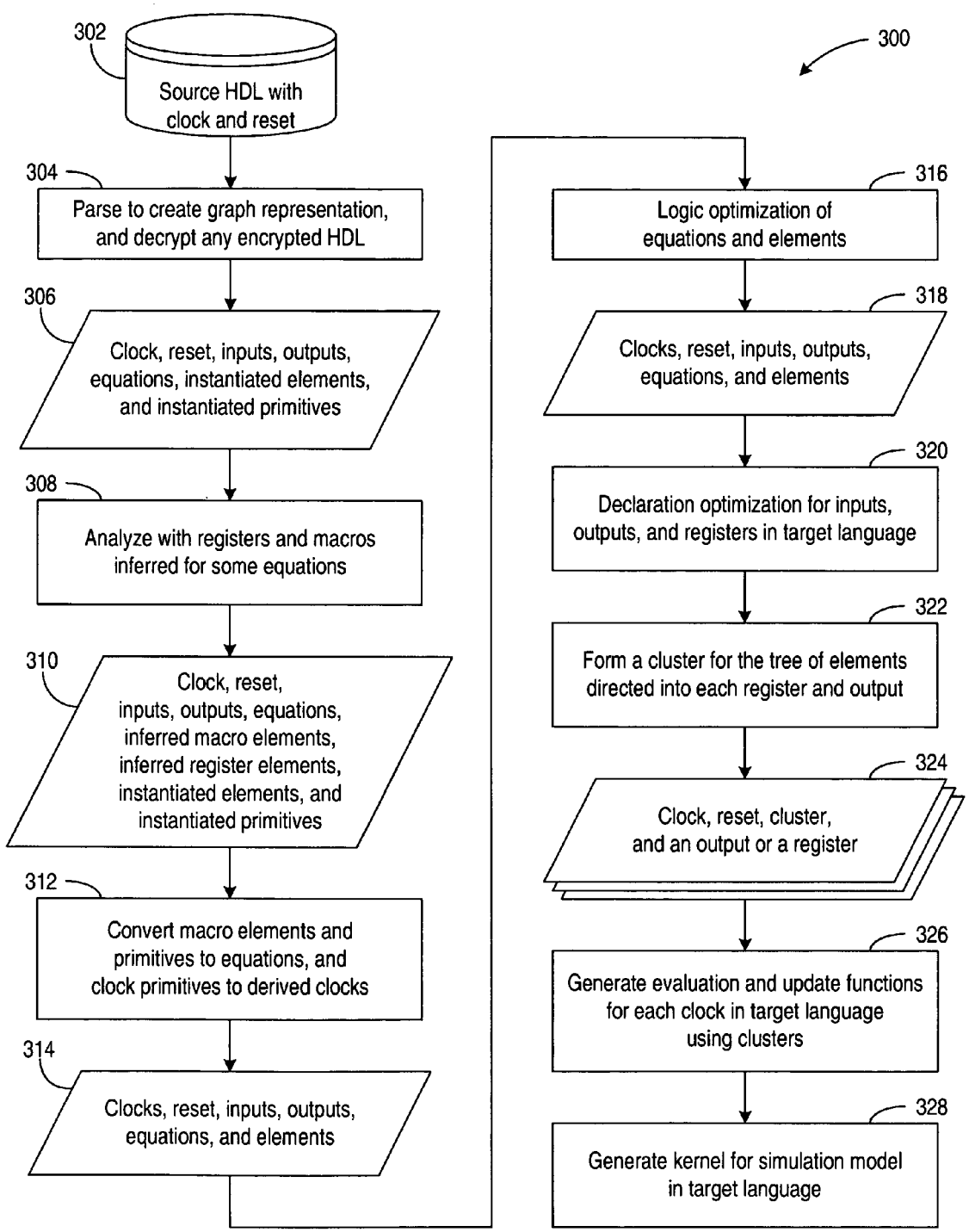
FIG. 3 is a flow chart of an example process for generating a simulation model from the HDL description of a synchronous digital system in accordance with various embodiments of the invention.

FIG. 3 is a flow chart of an example process 300 for generating a simulation model from the HDL description 302 of a synchronous digital system in accordance with various embodiments of the invention. The synchronous digital system with HDL description 302 may have more than one clock, but all clocks should have a fixed timing relationship with respect to a master clock. The synchronous digital system may have a single reset input that may be used to reset the registers of the digital system.

The process 300 may be implemented to generate a simulation model in a plurality of languages, such as a simulation model that is a C program, a Verilog module, or a VHDL entity.

The HDL description 302 is parsed at step 304 to create a graph representation 306. Graph representation 306 may include a master clock node, a reset node, input nodes, output nodes, behavioral equation nodes, instantiated element nodes, and instantiated primitive nodes.

The approach used to parse HDL 302 in step 304 may be the same approach that is used during synthesis for generating a hardware implementation for HDL 302. The HDL 302 may include one or more encrypted design description, and decryption software may be required to decrypt the encrypted design description. Existing logic simulation tools may be unable to simulate a digital design including encrypted design description, because existing logic simulation tools may not have access to the decryption software.

A parser used for synthesis may already include the decryption software to correctly process HDL including encrypted design description. Use of a parser from a synthesis tool in step 304, along with a user-provided key, allows the process 300 to generate a simulation model for a digital system that includes encrypted design description.

At step 308, the graph representation 306 is analyzed. During analysis of graph representation 306, registers and macros may be inferred for the function or a portion of the function of certain equation nodes. An element node may be added to the graph representation 306 for each inferred macro and register to yield the modified graph representation 310. The storage functions of the digital system, perhaps excluding storage functions associated with certain memory primitive nodes such as look-up table RAM (LUTRAM), may be isolated from combinatorial functions in a subset of the element and primitive nodes in graph representation 310. The analysis performed in step 308 may be identical to an analysis step performed during a synthesis of HDL 302.

At step 312, equivalent representations are substituted for the macro elements and primitives, including logic primitives and non-logic primitives, in graph representation 310 to yield the graph representation 314. The equivalent representation of nodes for macro elements and logic primitives may be an equation node with an instance of a task call to a library function. A library may provide functions that model the possible types of macros and logic primitives. The instance of a task call may be regarded as a "black box" having a port interface and contents that are not modified during later optimization steps.

Complex memory primitives, such as LUTRAM, may include a combinatorial function and a storage function. A LUTRAM may store an input data bit in one of 16 memory locations as specified by an input 4-bit address. Modeling complex memory primitives with a black box may appear to limit the complete isolation of registers from combinational functions. However, a LUTRAM may be considered to be a 16-bit register having one address input and one data input instead of the usual one data input. Thus, by classifying the black box for a LUTRAM as a register, graph representation 314 has each register isolated from combinatorial functions in either an equation node or an element node. In addition, each output is already isolated.

A clock generation primitive, such as a DCM, is a non-logic primitive that may generate additional clock signals from the master clock. The node representing a clock generation primitive may be replaced by an additional clock node for each clock generated by the clock generation primitive. The timing relationship between the clock signals may be used to generate the simulation model kernel as is later discussed in detail.

The functions included in a library of black box models may first be invoked during the logic simulation that executes the simulation model produced by process 300. Separate libraries may be provided for each possible language for the simulation model. The actual library referenced during a logic simulation may depend on the language selected by the designer. Each library may be fashioned to optimize the performance of a logic simulation in the corresponding language. In contrast to existing logic simulation tools, the contents of the library are not examined during the generation of the simulation model.

In creating a simulation model, the approach used to substitute black boxes for the macro elements and logic primitives may be identical to the approach used by a synthesis tool in generating a hardware implementation from HDL 302. If synthesis of the digital system is desired, an additional library including hardware models for the macro elements and logic primitives may be referenced.

Figure 4:
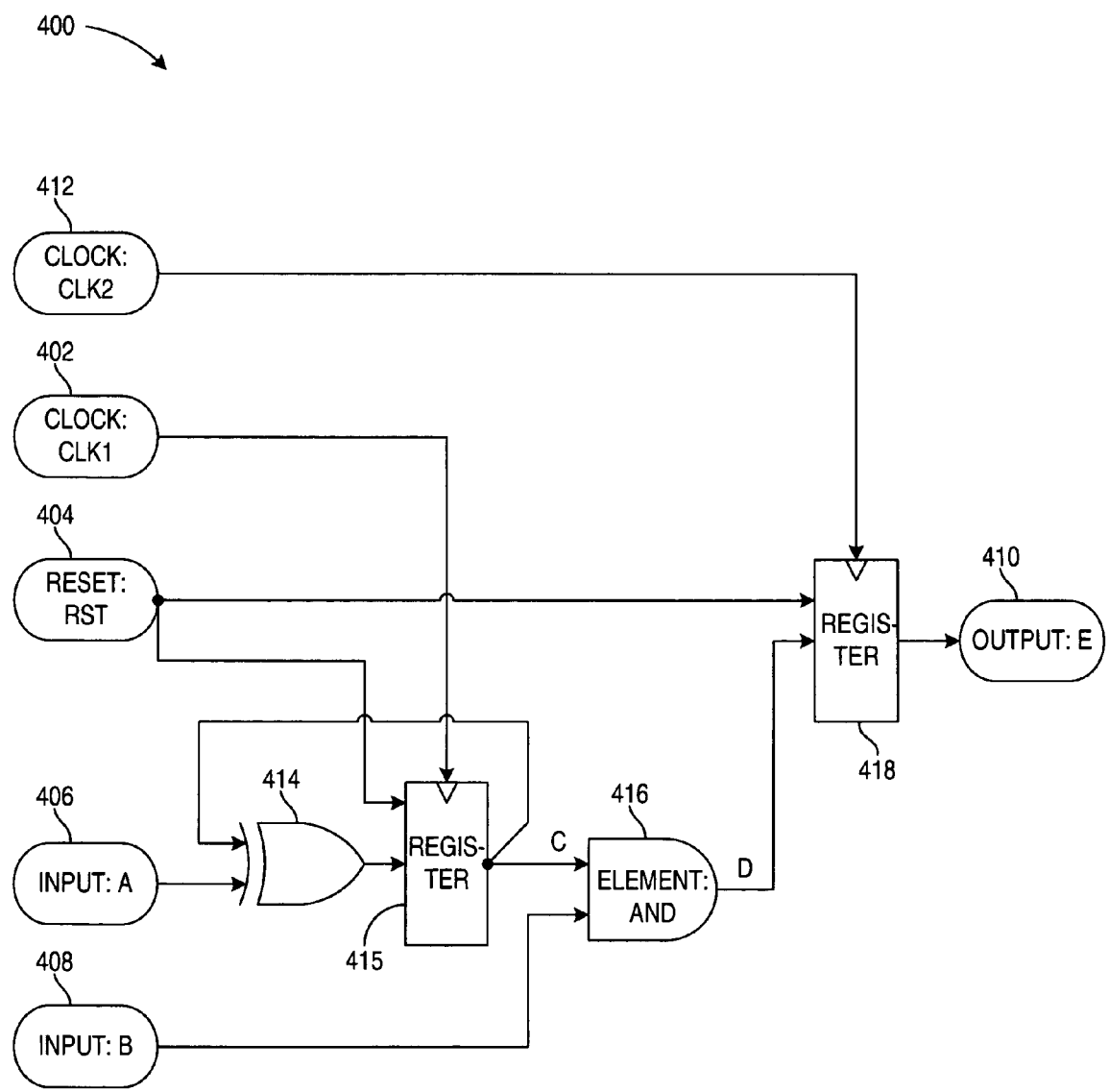
FIG. 4 is a graph representation of an example synchronous digital system for a PLD used to generate a simulation model.

At step 316, logic optimization of the equations and elements of graph representation 314 produces a compacted graph representation 318 (see FIG. 4, for example). The interface and contents of a black box may remain unmodified during logic optimization. Heuristics may be used to reduce the complexity of the combinational logic, including optimization of multi-output combinational logic blocks. A rich variety of logic optimization heuristics have been developed for synthesis of HDL 302 into a compact hardware implementation. These synthesis heuristics may be also used to generate a simulation model.

An improvement in execution speed may result for a simulation model generated by process 300 due to the compaction of the graph representation 318 by the logic optimization of step 316. Typically, equation nodes for combinational logic are converted to elements during the logic optimization. Graph representation 318 may include equation nodes with black boxes.

In one embodiment, the implementation of steps 304, 308, 312, and 316 may use the same approach used during a synthesis of HDL 302. The resulting graph representation 318 may be used to generate a hardware implementation, a simulation model, or both, as a system designer prefers. Step 320 may be the first step that is specific to the generation of a simulation model.

At step 320, an optimized declaration is generated for each input, output, and register of graph representation 318 in the target language of the simulation model. The target language for the simulation model may remain unspecified until step 320. For the example of the target language being the C programming language, signals and signal vectors (represented by an edge or a port of a node) having at most 8 bits may be declared as a character type "char", signal vectors having more than 8 bits but less than or equal to 16 bits may be declared as a "short", et cetera. In addition, formulas may be generated for bits or bit fields of signal vectors that are referenced by the HDL 302 when the target language does not directly support bit and/or bit field references.

At step 322, the element and equation nodes of graph representation 318 are clustered to form graph representation 324. A cluster may be formed for each register and system output, with each cluster including the tree of nodes feeding the input port of the register node or feeding the system output node, with the leaf nodes of the tree being input nodes or register nodes. A LUTRAM with two input ports has two corresponding cluster trees. The clusters may be generated by a graph search of graph representation 318.

At step 326, the clustered graph representation 324 is used to generate evaluation and update functions for the simulation model. The evaluation and update functions may be generated in the target language for the simulation model.

An evaluation function may be generated for each clock node of the system. Separate evaluation functions may be generated for each of the two clock phases of a clock for systems including registers clocked by the positive edge of the clock and registers clocked by the negative edge of the clock. An evaluation function for a clock may include an evaluation equation for each register clocked by the clock and may include an evaluation equation for each system output dependent on a register clocked by the clock. A system output dependent on multiple clocks may have an evaluation equation for multiple evaluation functions. The clocking of a register by a clock is indicated by an edge (in graph representation 324) between the clock node for the clock and the register node for the register.

Each evaluation equation for a register calculates the value of the register in the current clock cycle based on the values of the system inputs for the current clock cycle and values in registers for the previous clock cycle. Each evaluation equation for an output calculates the value of the output in the current clock cycle based on the values of the system inputs and registers for the current clock cycle. Each cluster in graph representation 324 is used to generate a corresponding evaluation equation for respective register or output.

A node with output port edges that fanout to multiple nodes may be included in more than one cluster. Thus, multiple evaluation equations may include expressions to calculate the value of the fanout point. A compiler for the target language may include common expression elimination, thereby preventing the values of fanout points from being repeatedly calculated. In another embodiment, a cluster is also formed for each fanout point.

The evaluation equation for a register may be interpreted as calculating the value at the input of a register. A LUTRAM may have two separate evaluation equations for the data and address inputs of the LUTRAM. A corresponding update equation for a register may be interpreted as the clocked transfer of the value at the input of a register to the output of the register. The update equation for a LUTRAM may additionally include a black box to decode the address.

An update function may be generated for each clock node of the system. An update function for a clock may include update equations for the registers clocked by the clock. An update equation for a register may update the register with a value calculated by a corresponding evaluation equation. In addition, an update function may include update equations for certain system inputs. The update equations for the system inputs provide the scenario stimulus for the logic simulation. An update function for a clock may include an update equation for each system input having a register clocked by the clock that is dependent on the system input.

At step 328, the kernel of the simulation model may be output. The kernel may include declarations for the inputs, outputs, and registers using the optimized declarations from step 320. Each register may have two declarations, one for a current value and one for a previous value.

The clock signals of the system have a fixed timing relationship. A least common multiple of the clock periods is used to generate a time interval function with a call to the respective evaluate and update functions for each clock signal in the order that the clock signal transitions occur in the interval. For transitions of multiple clock signals occurring simultaneously, the evaluate functions for all the multiple clock signals are called before calling the corresponding update functions.

The simulation model initializes the values of the register values with the reset values and then invokes the interval function repeatedly until the desired amount of simulation time is complete.

FIG. 4 is an example optimized graph representation 400 of the example synchronous digital system depicted by graph 200 in FIG. 2. Graph representation 200 of FIG. 2 corresponds to the resulting graph representation at block 306 of FIG. 3, and graph representation 400 corresponds to the resulting optimized graph representation at block 318 of FIG. 3.

Equation node 214 of FIG. 2 may include an inferred register which is isolated in step 308 of FIG. 3 by splitting node 214 of FIG. 2 into nodes 414 and 415. Element node 414 may additionally result from logic optimization step 316 of FIG. 3 transforming a full adder block into an XOR gate because the inputs to the full adder are 1-bit signal vectors in this example. Clock primitive 212 of FIG. 2 may be replaced by clock node 412 in the macro and primitive substitution step 312 of FIG. 3.

Step 322 of FIG. 3 forms a register cluster for CLK1 from input A (node 406), XOR gate 414, and register 415; forms a register cluster for CLK2 from input B (node 408), AND gate 416, and register 415; and forms an output cluster from register 418.

If the target language is the C programming language, the following evaluation and update functions may be generated (step 326 of FIG. 3), where the equations providing the input values for input A 406 and input B 408 are not specified:

```
void clock1_evaluate ( ) {
reg_c=reg_c_prev ^ input_a;
}
void clock1_update ( ) {
input_a=?;
reg_c_prev=reg_c;
}
void clock2_evaluate ( ) {
reg_e=reg_c_prev & input_b;
output_e=reg_e_prev;
}
void clock2_update ( ) {
input_b=?;
reg_e_prev=reg_e;
}
```

Graph representation 400 may have clock signal CLK2 (from node 412) with a period that is twice the period of clock signal CLK1 (node 402) with no phase shift. The following kernel may be generated in step 328 of FIG. 3 for graph representation 400:

```
char input_a, input_b, output_e;

char reg_c, reg_e;

char reg_c_prev, reg_e_prev;

#include eval_update.c
   void clock( ) {
   clock1_evaluate( );
   clock1_update( );
   clock1_evaluate( );
   clock2_evaluate( );
   clock1_update( );
   clock2_update( );
   }
   void reset( ) {
   reg_c_prev=0;
   reg_e_prev=0;
   }
   int main( ) {
   reset( );
   for( ; ; ) {
   clock( );
   }
   }
```

A simulation model may additionally be generated in an HDL language, such as Verilog or VHDL, according to various embodiments of the invention. An event driven simulator may be used for a logic simulation either directly from the source HDL or the simulation model generated according to various embodiments of the invention. A logic simulation of a simulation model generated according to various embodiments of the invention may achieve a speedup relative to a logic simulation of the source HDL, thereby allowing the event driven simulator to be used more efficiently.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for simulating logic designs and has been found to be particularly applicable and beneficial in generating a simulation model. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a clock accurate simulation model from a circuit design description, comprising:
   creating a graph representation of the circuit design description, wherein the graph representation includes nodes and edges, each node representing a circuit function from the design description, and each edge representing a signal flow between two nodes;
   generating from the nodes in the graph representation a plurality of register nodes corresponding to respective register functions;
   performing logic optimization on nodes that represent combinational logic functions; and
   generating an evaluation equation for each register node and each output node after performing logic optimization, wherein for each clock cycle of a logic simulation, each evaluation equation is evaluated and produces an output value for the next clock cycle.

2. The method of claim 1 further comprising generating a respective update equation for each register node and each input node, wherein each update equation is interpreted during simulation as a clocked transfer of the value at an input of a register to an output of the register.

3. The method of claim 2 further comprising:
   wherein the evaluation equations include output evaluation equations and register evaluation equations, and the update equations include input update equations and register update equations;
   associating each register evaluation equation and each register update equation with a transition of a clock of the circuit design description;
   associating each output evaluation equation and each input update equation with at least one transition of at least one clock of the circuit design description;
   generating for each clock at least one evaluation function, each evaluation function associated with a respective clock transition of a clock and including each evaluation equation associated with the clock transition; and
   generating for each clock at least one update function, each update function associated with a respective clock transition and including each update equation associated with the clock transition.

4. The method of claim 3 further comprising:
   generating declarations for inputs, outputs, and registers from the graph representation;
   generating a reset function that initializes values of the registers;
   generating a time interval function that invokes the evaluation and update functions in order of the associated clock transitions within a time interval; and
   generating a main function that during simulation invokes the reset function followed by repeatedly invoking the time interval function.

5. The method of claim 4 wherein the evaluation functions, update functions, declarations, reset function, time interval function, and main function are in a C programming language.

6. The method of claim 4 wherein the evaluation functions, update functions, declarations, reset function, time interval function, and main function are generated in a Verilog hardware description language.

7. The method of claim 4 wherein the evaluation functions, update functions, declarations, reset function, time interval function, and main function are generated in a VHDL.

8. The method of claim 4 wherein the evaluation functions, update functions, declarations, reset function, time interval function, and main function are generated in a language selected by a user.

9. The method of claim 1 wherein the step of creating further comprises decrypting encrypted design description with a user provided key.

10. The method of claim 1 further comprising, for each instance of a PLD primitive in the graph representation specifying a call to an equivalent function in a library.

11. The method of claim 10 wherein the equivalent function is optimized for a language.

12. The method of claim 11 wherein the equivalent function is optimized for the C programming language.

13. The method of claim 11 wherein the equivalent function is linked at simulation time.

14. The method of claim 1 wherein the step of performing a logic optimization uses synthesis heuristics.

15. The method of claim 1 wherein each evaluation equation is a function of register values and input values.

16. The method of claim 3, further comprising:
   wherein each register evaluation equation and register update equation is associated with a clock transition given by the clock signal input to a clock input of a corresponding register and a clock transition direction to which the register is sensitive;
   wherein each output evaluation equation is associated with at least one clock transition given by the clock and transition direction for the registers on which the output evaluation equation depends; and
   wherein each input update equation is associated with at least one clock transition given by the clock and transition direction for the registers on which the input update equation depends.

17. The method of claim 4 wherein the evaluation functions, update functions, declarations, reset function, time interval function, and main function are in a design description language, and each declaration uses a smallest available bit-width representation that is sufficient to represent the declaration available in the language.

18. The method of claim 4 wherein the time interval is a least common multiple of periods of the clocks for the circuit design description.

19. The method of claim 4 wherein for clock transitions occurring simultaneously, the evaluation functions associated with the simultaneous clock transitions are invoked before the update functions associated with the simultaneous clock transitions.

20. An apparatus for generating a clock accurate simulation model from a circuit design description, comprising:

means for creating a graph representation of the circuit design description, wherein the graph representation includes nodes and edges, each node representing a circuit function from the design description, and each edge representing a signal flow between two nodes;

means for generating from the nodes in the graph representation a plurality of register nodes corresponding to respective register functions;

means for performing logic optimization on nodes that represent combinational logic functions; and means for generating an evaluation equation for each register node and each output node after performing logic optimization, wherein for each clock cycle of a logic simulation, each evaluation equation is evaluated and produces an output value for the next clock cycle.

\* \* \* \* \*